(12) United States Patent
Ro et al.

(10) Patent No.: US 8,964,141 B2
(45) Date of Patent: Feb. 24, 2015

(54) THIN FILM TRANSISTOR, METHOD OF MANUFACTURING THE SAME, AND DISPLAY DEVICE HAVING THIN FILM TRANSISTOR

(75) Inventors: Sung-In Ro, Yongin (KR); Ji-Yong Park, Yongin (KR); Kyung-Min Park, Yongin (KR); Jin-Suk Park, Yongin (KR); Seong-Yeun Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 875 days.

(21) Appl. No.: 12/966,788

(22) Filed: Dec. 13, 2010

(65) Prior Publication Data
US 2011/0221991 A1 Sep. 15, 2011

(30) Foreign Application Priority Data
Mar. 10, 2010 (KR) .......................... 10-2010-0021263

(51) Int. Cl.
*G02F 1/136* (2006.01)
*H01L 29/786* (2006.01)
*H01L 27/12* (2006.01)
*H01L 29/423* (2006.01)
*H01L 29/66* (2006.01)

(52) U.S. Cl.
CPC ...... *H01L 29/78696* (2013.01); *H01L 27/1214* (2013.01); *H01L 29/42384* (2013.01); *H01L 29/66757* (2013.01); *H01L 29/78645* (2013.01)
USPC ................................. 349/47; 349/42; 349/43

(58) Field of Classification Search
USPC ..................................................... 349/42–47
See application file for complete search history.

(56) References Cited

U.S. PATENT DOCUMENTS

| 6,506,669 | B1 * | 1/2003 | Kuramasu et al. ............ 438/586 |
| 7,528,021 | B2 | 5/2009 | Park et al. |
| 7,535,520 | B2 | 5/2009 | Yoon et al. |
| 7,612,838 | B2 | 11/2009 | Lim et al. |
| 7,619,694 | B2 | 11/2009 | Lee et al. |

(Continued)

FOREIGN PATENT DOCUMENTS

| CN | 1794069 A | 6/2006 |
| CN | 1801492 A | 7/2006 |

(Continued)

OTHER PUBLICATIONS

Korean Office action issued by KIPO on Dec. 13, 2011, corresponding to KR 10-2010-0021263 and Request for Entry attached herewith.

(Continued)

*Primary Examiner* — Charles Chang
(74) *Attorney, Agent, or Firm* — Robert E. Bushnell, Esq.

(57) ABSTRACT

A thin film transistor, a manufacturing method thereof, and a display device having the same are disclosed. The thin film transistor includes a semiconductor layer formed on a substrate, a gate insulating layer formed on the substrate including the semiconductor layer, a gate electrode formed on the gate insulating above the semiconductor layer, source and drain electrodes connected to the semiconductor layer, and 3.5 to 4.5 protrusions formed on the semiconductor layer overlapped with the gate electrode. Malfunction of the thin film transistor and inferior image quality of the display device can be prevented by adjusting the number of protrusions to minimize leakage current and defects.

23 Claims, 6 Drawing Sheets

(56) References Cited

U.S. PATENT DOCUMENTS

| | | |
|---|---|---|
| 7,633,473 B2 | 12/2009 | Uh et al. |
| 7,646,023 B2 | 1/2010 | Park et al. |
| 7,719,634 B2 | 5/2010 | Lee et al. |
| 2001/0049163 A1 | 12/2001 | Yamazaki et al. |
| 2002/0033927 A1 | 3/2002 | Mun et al. |
| 2005/0243263 A1 | 11/2005 | Yoon |
| 2006/0131585 A1* | 6/2006 | Kim et al. ............ 257/66 |
| 2006/0152644 A1 | 7/2006 | Yi |
| 2006/0157711 A1* | 7/2006 | Kang ............... 257/72 |
| 2006/0158600 A1 | 7/2006 | Mun et al. |
| 2006/0209245 A1 | 9/2006 | Mun et al. |
| 2006/0227271 A1 | 10/2006 | Park |
| 2007/0263163 A1 | 11/2007 | Mun et al. |
| 2007/0272928 A1* | 11/2007 | Park et al. ............ 257/72 |
| 2008/0266503 A1 | 10/2008 | Lyu |
| 2008/0284964 A1 | 11/2008 | Mun et al. |
| 2009/0128725 A1 | 5/2009 | Mun et al. |
| 2009/0305444 A1 | 12/2009 | Yoon |
| 2009/0315031 A1 | 12/2009 | Kim et al. |
| 2010/0051933 A1 | 3/2010 | Kim et al. |

FOREIGN PATENT DOCUMENTS

| | | |
|---|---|---|
| JP | 2001284601 A | 10/2001 |
| KR | 10-2006-0055210 A | 5/2006 |
| KR | 1020070114880 A | 12/2007 |
| KR | 10-2008-0024338 | 3/2008 |
| KR | 10-2008-0051627 | 6/2008 |

OTHER PUBLICATIONS

Korean Office Action issued by Korean Patent Office on May 25, 2011, corresponding to Korean Patent Application No. 10-2010-0021263 and Request for Entry of the Accompanying Office Action attached herewith.

Chinese Office Action issued by Chinese Patent Office on Sep. 16, 2014 in connection with corresponding Chinese Patent Application No. 201110006612.8 and Request for Entry of the Accompanying Office Action attached herewith.

\* cited by examiner

THIN FILM TRANSISTOR, METHOD OF MANUFACTURING THE SAME, AND DISPLAY DEVICE HAVING THIN FILM TRANSISTOR

CLAIM OF PRIORITY

This application makes reference to, incorporates the same herein, and claims all benefits accruing under 35 U.S.C. §119 from an application earlier filed in the Korean Intellectual Property Office on the 10 Mar. 2010 and there duly assigned Serial No. 10-2010-0021263.

BACKGROUND OF THE INVENTION

1. Field of the Invention

The present invention relates to a thin film transistor, a method of manufacturing the same, and a display device having the thin film transistor and, more particularly, to a thin film transistor having a semiconductor layer formed by sequential lateral solidification (SLS), a method of manufacturing the same, and a display device having the thin film transistor.

2. Description of the Related Art

Liquid crystal display devices using the electro-optic property of a liquid crystal are classified into a passive matrix type and an active matrix type. The active matrix type liquid crystal display device using a thin film transistor is excellent in view of resolution and capability of displaying a moving picture, and is used more widely than the passive matrix type.

The active matrix type liquid crystal display device (TFT-LCD) includes a display panel into which liquid crystal is injected between two substrates, a backlight disposed at the rear side of the display panel and used as a light source, and a drive IC for driving the display panel. Light entered into the display panel from the back light is modulated by the liquid crystal oriented according to a signal provided from the drive IC, and is outputted to the outside so that texts and images are displayed.

In the active matrix type liquid crystal display device, the thin film transistor is formed on the substrate adjacent to the back light. Particularly, a top gate structured thin film transistor, a semiconductor layer of which has a channel region, is formed adjacent to the substrate. Therefore, the electrical property is changed such that leakage current is increased by increase of carriers due to electron hole pairs generated by incident light from the back light. As a result, brightness is changed or there is a malfunction such as vertical crosstalk in which light is emitted in a vertical line form so that image quality is deteriorated. Such malfunction becomes deeper as brightness of the back light increases.

SUMMARY OF THE INVENTION

Accordingly, embodiments of the present invention provide a thin film transistor capable of minimizing leakage current caused by electron holes, a method of manufacturing the same, and a display device including the thin film transistor.

Embodiments of the present invention provide a thin film transistor for maintaining an electrical property uniform, a method of manufacturing the same, and a display device including the thin film transistor.

In order to achieve the foregoing and/or other aspects of the present invention, according to an embodiment of the present invention, a thin film transistor includes: a semiconductor layer formed on a substrate; a gate insulating layer formed on the substrate including the semiconductor layer; a gate electrode formed on the gate insulating layer above the semiconductor layer; a source electrode and a drain electrode connected to the semiconductor layer; and 3.5 to 4.5 protrusions provided on the semiconductor layer overlapped with the gate electrode.

According to embodiments of the present invention, a method of manufacturing a thin film transistor includes: forming an amorphous semiconductor layer on a substrate; solidifying the amorphous semiconductor layer; forming a gate insulating layer on the semiconductor layer on which protrusions are formed by the solidification; forming a gate electrode on the gate insulating layer; and forming a source electrode and a drain electrode connected to the semiconductor layer; wherein the gate electrode is overlapped with 3.5 to 4.5 protrusions.

According to embodiments of the present invention, a display device having a thin film transistor includes: a first substrate on which a thin film transistor and a first electrode connected to the thin film transistor are formed; a second substrate on which a second electrode is formed; and a liquid crystal layer injected into a sealed space between the first electrode and the second electrode; wherein the thin film transistor includes a semiconductor layer formed on the first substrate, a gate insulating layer formed on the first substrate and including the semiconductor layer, a gate electrode formed on the gate insulating layer above the semiconductor layer, a source electrode and a drain electrode connected to the semiconductor layer, and 3.5 to 4.5 protrusions formed on the semiconductor layer overlapped with the gate electrode.

The thin film transistor, according to the embodiments of the present invention, includes a semiconductor layer crystallized by sequential lateral solidification (SLS) method, and the semiconductor layer overlapped with the gate electrode includes a plurality of protrusions. The protrusions are formed perpendicular to the longitudinal direction of the semiconductor layer when an amorphous semiconductor layer is crystallized by the SLS method.

When the number of protrusions of the semiconductor layer overlapped with the gate electrode is increased over a predetermined number, since a threshold voltage is changed to a positive (+) voltage due to decrease of a short channel effect, the leakage current may be decreased. However, since defect is increased, electrical property is deteriorated due to decrease of current. In addition, when the number of protrusions of the semiconductor layer overlapped with the gate electrode is decreased lower than a predetermined number, since the leakage current is increased due to the short channel effect, the thin film transistor malfunctions.

According to the embodiments of the present invention, the semiconductor layer overlapped with the gate electrode includes 3.5 to 4.5 protrusions. When the number of protrusions is adjusted, as described above, in order to minimize the leakage current and the defect, the electrical property of the thin film transistor can be maintained uniform, and inferior image quality of the display device caused by the malfunction can be prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

In the following detailed description, only certain exemplary embodiments of the present invention have been shown and described, simply by way of illustration. As those skilled in the art will realize, the described embodiments may be modified in various different ways, all without departing from the spirit or scope of the present invention. Accordingly, the drawings and description are to be regarded as illustrative in nature and not restrictive. In addition, when an element is referred to as being "on" other element, it can be directly on the other element or be indirectly on the other element with one or more intervening elements interposed therebetween. Also, when an element is referred to as being "connected to" other element, it can be directly connected to the other element or be indirectly connected to the other element with one or more intervening elements interposed therebetween. Hereinafter, like reference numerals refer to like elements.

Figure 1A:
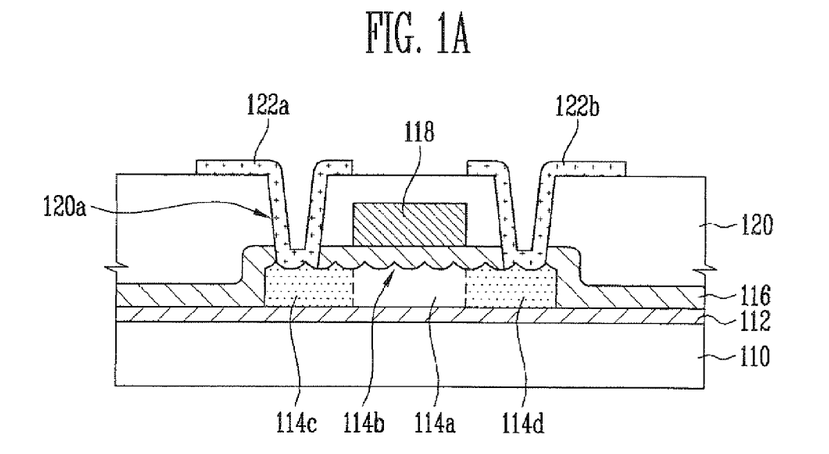
FIG. 1A is a sectional view illustrating a thin film transistor according to an embodiment of the present invention.
Figure 1B:
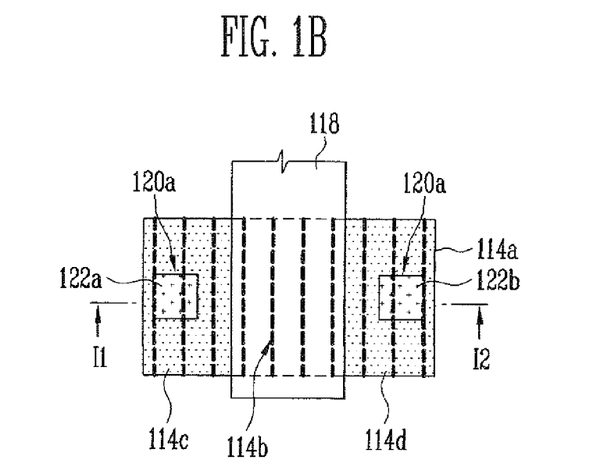
FIG. 1B is a plan view illustrating the thin film transistor according to an embodiment of the present invention.

FIGS. 1A and 1B are a sectional view and a plan view, respectively, illustrating a thin film transistor according to an embodiment of the present invention. FIG. 1A is a sectional view taken along the line I1-I2 of FIG. 1B.

Referring to FIGS. 1A and 1B, a buffer layer 112 is formed on a substrate 110 and a semiconductor layer 114a is formed on the buffer layer 112. The semiconductor layer 114a, including a source region and a drain region 114c and 114d, respectively, is made of poly-silicon and includes a plurality of protrusions 114b formed on the surface. The protrusions 114b may be formed at a regular interval, such as 2 μm to 3 μm, and may be perpendicular to the longitudinal direction of the semiconductor layer 114a, that is, have a band form arranged parallel to the longitudinal direction of the semiconductor layer 114a.

A gate insulating layer 116 is formed on the buffer layer 112 including the semiconductor layer 114a, and a gate electrode 118 is formed on the gate insluting layer 116. The gate electrode 118 is overlapped with 3.5 to 4.5 protrusions 114b among the protrusions 114b that are formed on the semiconductor layer 114a. The statement "0.5 of the number of the protrusions 114a" means that the protrusions 114b overlap with an edge of the gate electrode 118 by about ½.

An interlayer insulating layer 120 is formed on the gate insulating layer 116 including the gate electrode 118, and contact holes 120a are formed on the interlayer insulating layer 120 and the gate insulating layer 112 so as to expose the semiconductor layer 114a of the source and drain regions 114a and 114d, respectively. A source electrode 122a and a drain electrode 122b are formed on the interlayer insulating layer 120, and are connected to the semiconductor layer 114a of the source and drain regions 114c and 114d through the contact holes 120a.

The present invention will be described in detail through a method of manufacturing the thin film transistor.

FIGS. 2A thru 2E are sectional views illustrating a method of manufacturing a thin film transistor according to embodiments of the present invention.

Figure 2A:
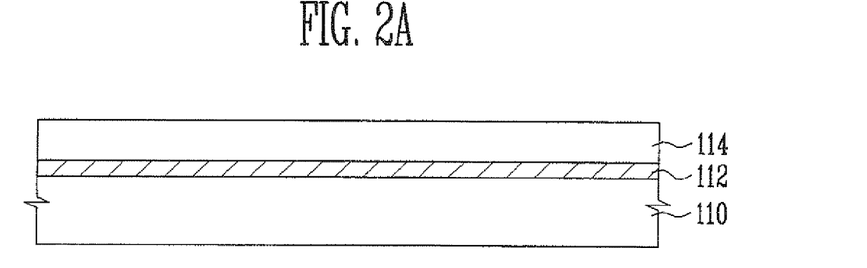
FIGS. 2A thru 2E are sectional views illustrating a method of manufacturing a thin film transistor according to an embodiment of the present invention.

Referring to FIG. 2A, the buffer layer 112 and the amorphous semiconductor layer 114 are sequentially formed on the substrate 110. The amorphous semiconductor layer 114 may be formed by depositing amorphous silicon by chemical vapor deposition (CVD) or a sputtering method.

Figure 2B:
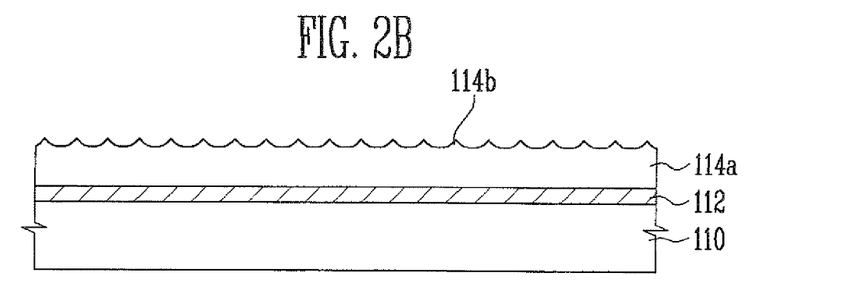

Referring to FIG. 2B, the amorphous semiconductor layer 114 is solidified. Solidification is a process of changing the amorphous silicon (Si) into a single crystal or poly-crystal silicon (grain) so as to increase the mobility of carriers, and may be performed by a sequential lateral solidification (SLS) method. When using the SLS method, the solidification direction may be uniform so as to increase the carrier mobility, but band-shaped protrusions 114b are formed perpendicular to the direction where a laser beam travels during the solidification. The protrusions 114b are formed at a grain boundary to which solidified grains face. Therefore, the amorphous semiconductor layer 114 is changed into a crystalline semiconductor layer 114a, including a plurality of protrusions 114b, by the solidification.

Figure 2C:
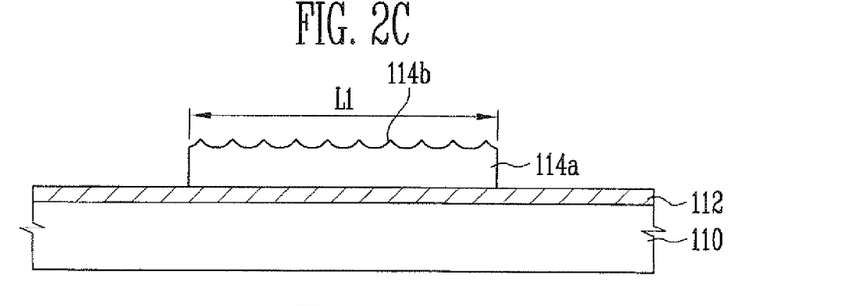

Referring to FIG. 2C, the crystalline semiconductor layer 114a is patterned. The crystalline semiconductor layer 114a is used as an active layer of the thin film transistor and is patterned so as to have a predetermined length L1 by considering the sizes of the source and drain regions and the channel region.

Referring to FIG. 2C, the gate insulating layer 116 is formed on the buffer layer 112 including the crystalline semiconductor layer 114a on which the protrusions 114b are formed, and the gate electrode 118 is formed on the gate insulating layer 116. N- or P-impurity ions are injected into the crystalline semiconductor layer 114a by an ion injecting process using the gate electrode 118 as a mask to form the source and drain regions 114c and 114d, respectively.

The gate electrode 118 is patterned so as to have a predetermined length L2 by an etching process using a photoresist film pattern as a mask, that is, so as to be overlapped with 3.5 to 4.5 protrusions 114b. For example, when a distance between the protrusions 114b is 2 μm to 3 μm, the length L2 of the gate electrode 118 may be patterned by 7 μm to 13.5 μm.

Figure 2D:
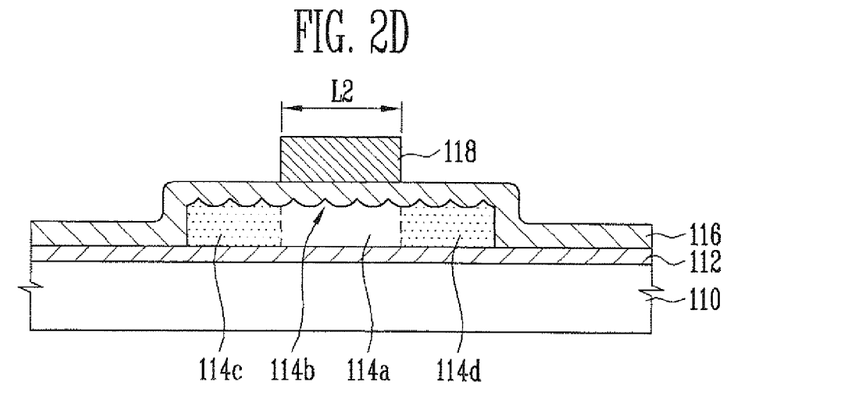

Referring to FIG. 2D, the interlayer insulating layer 120 is formed on the gate insulating layer 116 including the gate electrode 118, and the interlayer insulating layer 120 and the gate insulating layer 116 are patterned so as to form the contact holes 120a such that the semiconductor layer 114a of the source and drain regions 114c and 114d, respectively, is exposed. Source and drain electrodes 122a and 122b, respectively, are formed so as to be connected to the crystalline semiconductor layer 114a of the source and drain regions 114c and 114d, respectively, through the contact holes 120a.

Figure 2E:
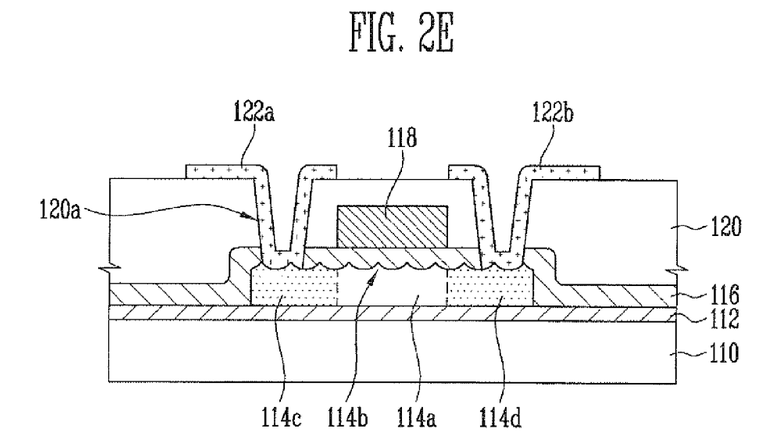
Figure 3A:
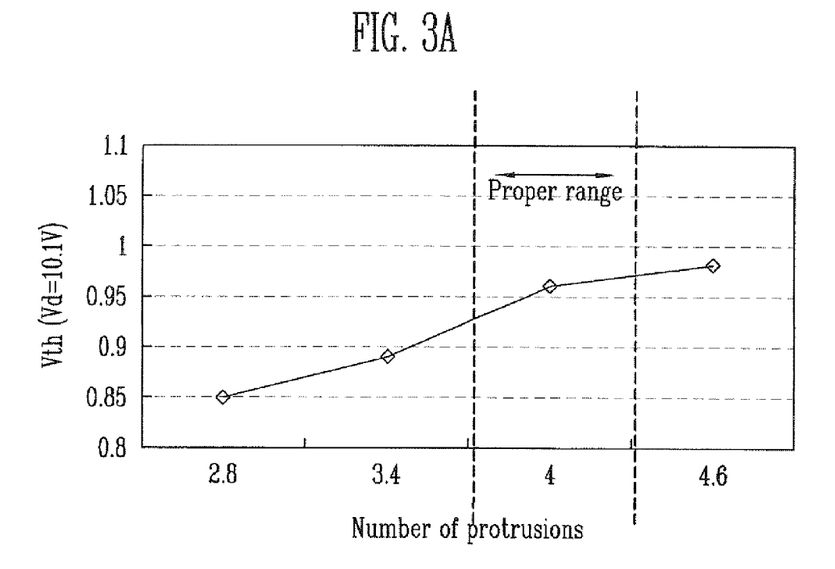
FIG. 3A is a graph illustrating change of a threshold voltage (Vth) of the thin film transistor with respect to the number of protrusions.
Figure 3B:
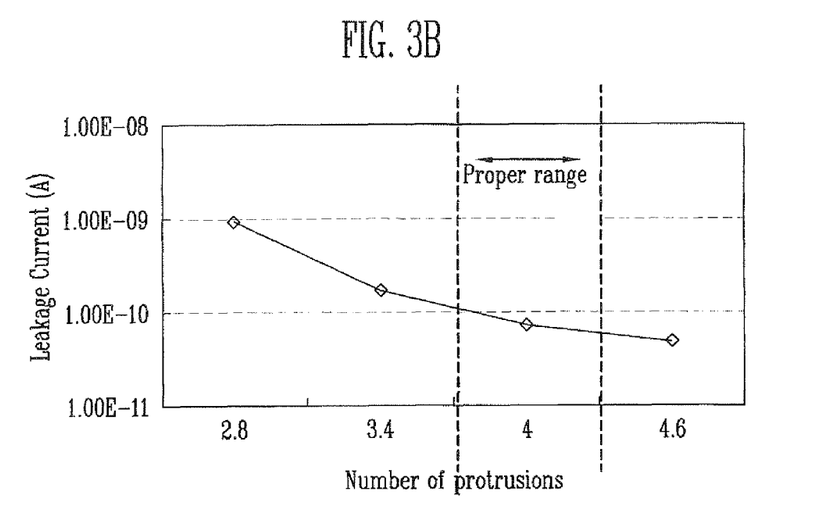
FIG. 3B is a graph illustrating a change of leakage current of the thin film transistor with respect to the number of protrusions.
Figure 3C:
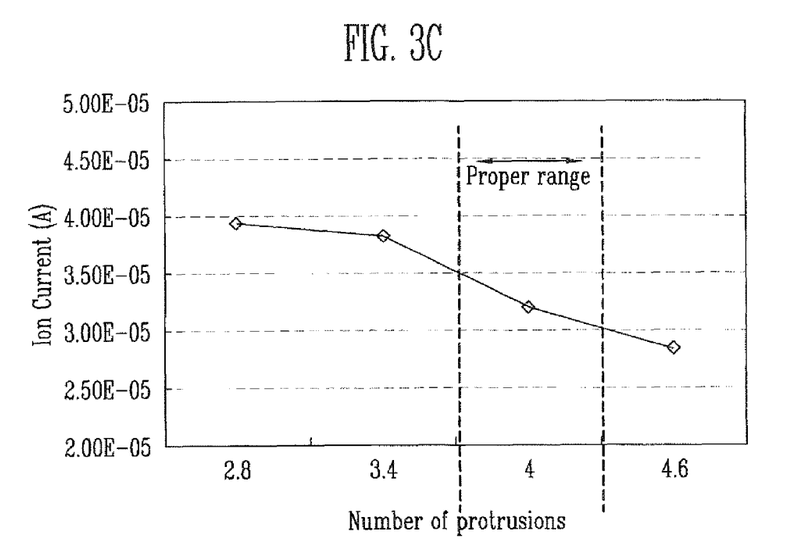
FIG. 3C is a graph illustrating a change of current of the thin film transistor with respect to the number of protrusions.

Referring to FIG. 2E, when the gate electrode 118 is overlapped with more than 4.5 protrusions 114b during the patterning of the gate electrode 118, since, as shown in FIG. 3A, a threshold voltage Vth is increased toward a positive (+) voltage due to decreased short channel effect, leakage current may be reduced, as illustrated in FIG. 3B. However, since a defect is increased, the electrical property is deteriorated by the reduced ion current due to reduced ions as illustrated in FIG. 3C.

When the gate electrode 118 is overlapped with less than 3.5 protrusions 114b during the patterning of the gate electrode 118, since the threshold voltage Vth, as illustrated in FIG. 3A, is reduced by the short channel effect, the leakage current is increased, as illustrated in FIG. 3B, and the thin film transistor may malfunction.

In the embodiments of the present invention, 3.5 to 4.5 protrusions 114b are provided on the semiconductor layer 114a overlapped with the gate electrode 118. In order to maintain a predetermined threshold voltage Vth (see FIG. 3A) and to minimize inferior electrical property (see FIG. 3C) due to leakage current (see FIG. 3B) and defect, the number of protrusions 114b is adjusted as described above to prevent the thin film transistor from malfunctioning.

Figure 4:
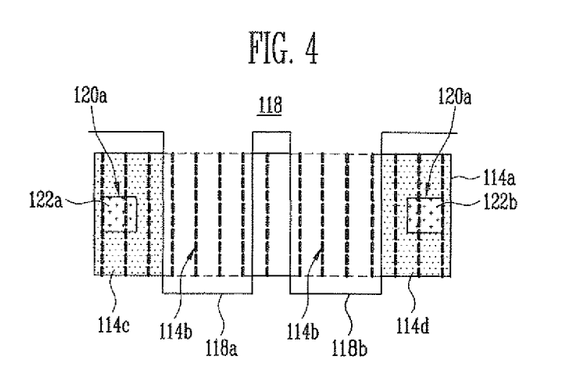
FIG. 4 is a plan view illustrating a thin film transistor according to another embodiment of the present invention.

The embodiments of the present invention may be applied to a thin film transistor having a double gate structure. FIG. 4 is a plan view illustrating a thin film transistor according to another embodiment of the present invention, and shows the gate electrode 118, as illustrated in FIGS. 1A and 1B, divided into two.

Referring to FIG. 4, two gate electrodes 118a and 118b are overlapped with the semiconductor layer 114a, and the semiconductor layer 114a overlapped with the two gate electrodes 118a and 118b is provided with 3.5 to 4.5 protrusions 114b.

In addition, the embodiments of the present invention may be applied to an active matrix type liquid crystal display device.

Figure 5:
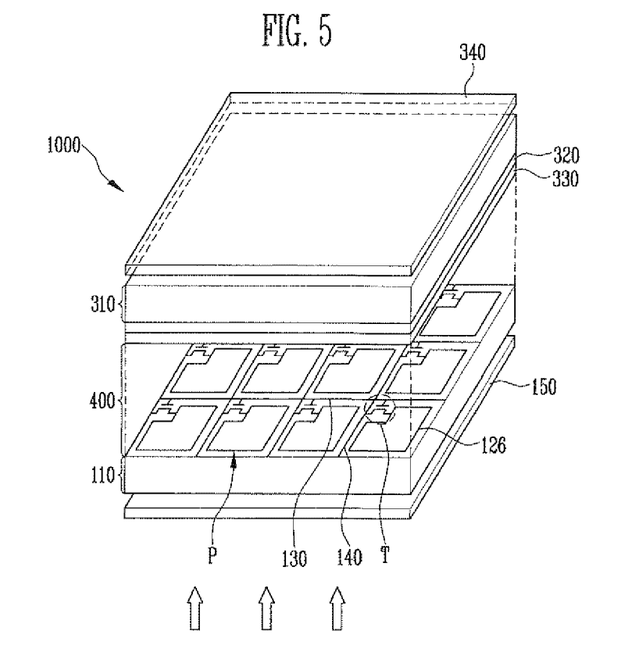
FIG. 5 is a perspective view illustrating a liquid crystal display device to which the thin film transistor according to the embodiment of the present invention is applied.

FIG. 5 is a perspective view illustrating a liquid crystal display device to which the thin film transistor according to the embodiment of the present invention is applied. The liquid crystal display device will be described by focusing a display panel 1000 for displaying an image.

The display panel 1000 includes two substrates 110 and 310 facing each other, and a liquid crystal layer 400 is disposed between the two substrates 110 and 310.

On the substrate 110, a plurality of gate lines 130 and data lines 140 arranged in the form of a matrix are disposed, and pixels P are defined by the gate lines 130 and the data lines 140. On the substrate 110 at positions where the gate lines 130 intersect the data lines 140, thin film transistors T for controlling signals to be supplied to the pixels P, and pixel electrode 126 connected to the thin film transistors T, are formed. The thin film transistors T are connected to capacitors (not shown) for maintaining signals.

The thin film transistors T may be formed so as to have the structure as illustrated in FIG. 1A or 1B, the data lines 140 may be formed during the forming of the source and drain electrodes 122a and 122b, respectively, and the gate lines 130 may be formed during the forming of the gate electrode 118.

On the substrate 310, a color filter 320 and a common electrode 330 are formed. On rear sides of the substrates 110 and 310, polarizers 150 and 340 are formed, respectively, and a back light (not shown) as a light source is disposed under the substrate 110.

In addition, around the pixels P of the display panel 1000, an LCD drive IC (not shown) for driving the display panel 1000 is mounted. The LCD drive IC converts an electric signal provided from the outside into a scan signal and a data signal, and supplies the converted signals to the gate lines 130 and the data lines 140.

Figure 6:
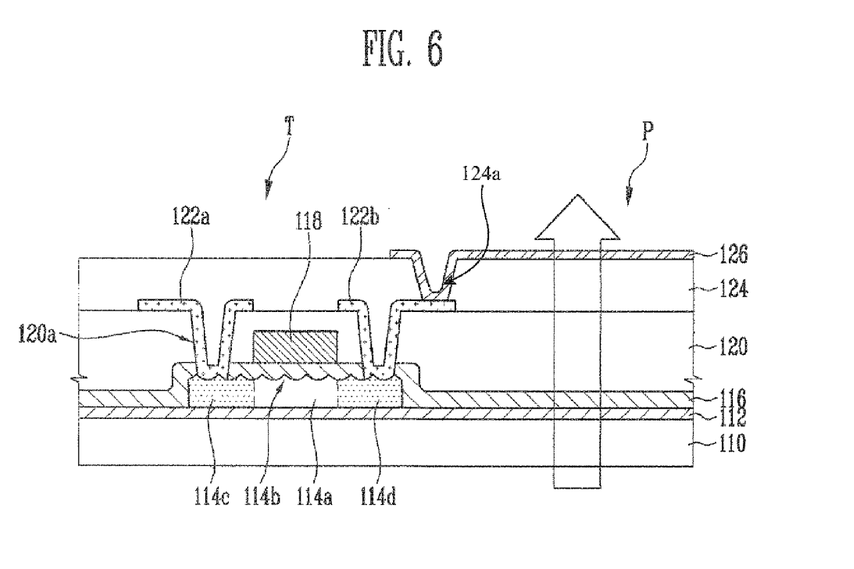
FIG. 6 is a sectional view illustrating a substrate of FIG. 5 in more detail.

FIG. 6 is a sectional view illustrating a substrate of FIG. 5 in more detail, and shows the thin film transistor T and the pixel P.

Referring to FIG. 6, the thin film transistor T includes the semiconductor layer 114a formed on the substrate 110, the gate insulating layer 116 formed on the substrate 110 including the semiconductor layer 114a, the gate electrode 118 formed on the gate insulating layer 116 above the semiconductor layer 114a, and the source and drain electrodes 122a and 122b, respectively, which are connected to the semiconductor layer 114a. The interlayer insulating layer 120 may be formed on the gate insulating layer 116 including the gate electrode 118, and the source and drain electrodes 122a and 122b, respectively, may be connected to the semiconductor layer 114a through the contact holes 120a which are formed in the interlayer insulating layer 120 and the gate insulating layer 116.

The semiconductor layer 114a is made of poly-crystal silicon and includes a plurality of protrusions 114b formed on the surface. The gate electrode 118 is overlapped with 3.5 to 4.5 protrusions 114b among the protrusions formed on the semiconductor layer 114a.

An insulating layer 124 is formed on the interlayer insulating layer 120 including the source and drain electrodes 122a and 122b, respectively, and the pixel electrode 126 connected to the source electrode 122a or the drain electrodes 122b through a via hole 124a is formed on the insulating layer 124.

Above the above-mentioned substrate 110, the substrate 310 of FIG. 5, on which the common electrode 330 facing the pixel electrode 126 is formed, is disposed and the liquid crystal layer 400 of FIG. 5 is injected into a sealed space between the substrates 110 and 310.

The liquid crystal display device, including the display panel 1000 of FIG. 5, displays text and an image when light from the back light installed at the rear side of the substrate 110 enters the liquid crystal layer 400 of the pixel region, is modulated by the liquid crystal oriented according to a voltage applied from the LCD drive IC to the pixel electrode 126 and the common electrode 330, and is emitted to the outside through the substrate 310.

Each of the thin film transistors T of the display panel 1000 includes 3.5 to 4.5 protrusions formed on the semiconductor layer 114a overlapped with the gate electrode 118. The number of the protrusions 114b is adjusted as described above to maintain a predetermined threshold voltage Vth (See FIG. 3A) and to minimize deterioration of electrical property (See FIG. 3C) due to the leakage current (See FIG. 3B) and defect so that malfunction can be effectively prevented.

Figure 7:
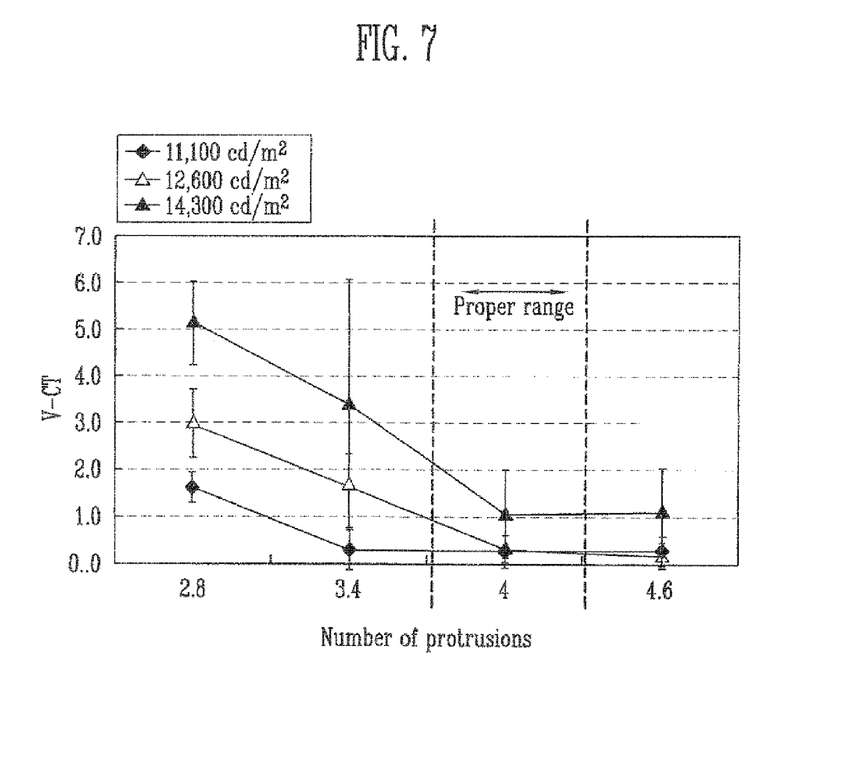
FIG. 7 is a graph illustrating a crosstalk (V-CT) of the display device with respect to the number of protrusions.

FIG. 7 is a graph illustrating measurement of a generated vertical crosstalk of the display device with respect to brightness of the back light and the number of protrusions 114b. The brightness of the backlight is increased to 11,100 cd/m$^2$, 12,600 cd/m$^2$, and 14,300 cd/m$^2$, respectively.

Referring to FIG. 7, the crosstalk V-CT is generated tremendously when the number of protrusions is less than 3.5, but is effectively reduced when the number of protrusions is higher than 3.5. Particularly, the crosstalk V-CT is generated by about 1% at high brightness of 14,300 cd/m$^2$, and this is a result of the reduction of the leakage current as illustrated in FIG. 3B. In general, less than 3% is determined to be a good level.

However, when the number of protrusions is higher than 4.5, since the electrical property, as described above, is deteriorated due to the increase of defects, the number of protrusions 114b may be adjusted within 3.5 to 4.5 according to the present invention.

That is, since the length of the channel is increased by the protrusions, even when electron hole pairs are generated by the incident light from the back light and carriers are increased, the leakage current is decreased and a malfunction, such as crosstalk, is minimized by this principle.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor, comprising:
    a semiconductor layer formed on a substrate;
    a gate insulating layer formed on the substrate including the semiconductor layer;
    a gate electrode formed on the gate insulating layer above the semiconductor layer;
    a source electrode and a drain electrode connected to the semiconductor layer; and
    a plurality of protrusions provided on the semiconductor layer which is overlapped with the gate electrode, a regular interval between the protrusions being in a range of 2 µm to 3 µm, wherein the gate electrode is divided into two gate electrodes and each gate electrode overlaps 3.5 to 4.5 protrusions.

2. The thin film transistor as claimed in claim 1, wherein the semiconductor layer is made of poly-crystal silicon.

3. The thin film transistor as claimed in claim 1, wherein the protrusions are formed on a surface of the semiconductor layer in the form of a band.

4. The thin film transistor as claimed in claim 1, wherein the protrusions are arranged perpendicular to a longitudinal direction of the semiconductor layer.

5. The thin film transistor as claimed in claim 1, wherein the semiconductor layer is solidified by a sequential lateral solidification (SLS) and the protrusions are formed by the solidification.

6. The thin film transistor as claimed in claim 1, further comprising an insulating layer formed on the gate insulating layer including the gate electrodes;
    wherein the source electrode and the drain electrode are connected to the semiconductor layer through contact holes which are formed in the insulating layer and the gate insulating layer.

7. The thin film transistor as claimed in claim 1, further comprising a buffer layer formed between the substrate and the semiconductor layer.

8. A method of manufacturing a thin film transistor, comprising;
    forming an amorphous semiconductor layer on a substrate;
    solidifying the amorphous semiconductor layer;
    forming a gate insulating layer on the amorphous semiconductor layer on which protrusions are formed by the solidifying step;
    forming a gate electrode on the gate insulating layer, wherein the gate electrode is divided into two gate electrodes; and
    forming a source electrode and a drain electrode connected to the amorphous semiconductor layer;
    wherein each of the gate correspondingly overlaps 3.5 to 4.5 protrusions formed on the amorphous semiconductor layer, a regular interval between the protrusions being in a range of 2 µm to 3 µm.

9. The method as claimed in claim 8, wherein the amorphous semiconductor layer is made of amorphous silicon.

10. The method as claimed in claim 8, wherein solidifying the amorphous semiconductor layer is accomplished by a sequential lateral solidification (SLS).

11. The method as claimed in claim 8, wherein the protrusions are formed on the surface of the amorphous semiconductor layer in the form of a band.

12. The method as claimed in claim 8, wherein the protrusions are arranged perpendicular to a longitudinal direction of the amorphous semiconductor layer.

13. The method as claimed in claim 8, further comprising:
    forming an insulating layer on the gate insulating layer including the two gate electrodes; and
    forming contact holes to expose the amorphous semiconductor layer by patterning the insulating layer and the gate insulating layer;
    wherein the source electrode and the drain electrode are connected to the amorphous semiconductor layer through the contact holes.

14. A display device, comprising:
    a first substrate on which a thin film transistor and a first electrode connected to the thin film transistor are formed;
    a second substrate on which a second electrode is formed; and
    a liquid crystal layer injected into a sealed space between the first electrode and the second electrode;
    wherein the thin film transistor comprises:
        a semiconductor layer formed on the first substrate;
        a gate insulating layer formed on the first substrate and including the semiconductor layer;
        two gate electrodes formed on the gate insulating layer above the semiconductor layer;
        a source electrode and a drain electrode connected to the semiconductor layer; and
        each of the gate electrodes overlapping 3.5 to 4.5 protrusions formed on the semiconductor layer.

15. The display device as claimed in claim 14, further comprising a gate line and a data line formed on the first substrate, wherein a pixel is defined by the gate line and the data line.

16. The display device as claimed in claim 14, wherein the semiconductor layer is made of poly-crystal silicon.

17. The display device as claimed in claim 14, wherein the protrusions are arranged at a regular interval.

18. The display device as claimed in claim 17, wherein the regular interval between the protrusions is in a range of 2 µm to 3 µm.

19. The display device as claimed in claim 14, wherein the protrusions are formed on a surface of the semiconductor layer in the form of a band.

20. The display device as claimed in claim 14, wherein the protrusions are arranged perpendicular to a longitudinal direction of the semiconductor layer.

21. The display device as claimed in claim 14, wherein the semiconductor layer is solidified by a sequential lateral solidification (SLS) and the protrusions are formed by the solidification.

22. The display device as claimed in claim 14, further comprising an insulating layer formed on the gate insulating layer including the gate electrodes,
    wherein the source electrode and the drain electrode are connected to the semiconductor layer through contact holes formed in the insulating layer and the gate insulating layer.

23. The display device as claimed in claim 14, further comprising a buffer layer formed between the substrate and the semiconductor layer.

\* \* \* \* \*